United States Patent [19]

Palm

[11] Patent Number: 5,197,326

[45] Date of Patent: Mar. 30, 1993

[54] ARRANGEMENT FOR MONITORING ROTATIONAL SPEED SENSOR

[75] Inventor: Hermann Palm, Waiblingen, Fed. Rep. of Germany

[73] Assignee: Robert Bosch GmbH, Stuttgart, Fed. Rep. of Germany

[21] Appl. No.: 705,333

[22] Filed: May 24, 1991

[30] Foreign Application Priority Data

Aug. 18, 1990 [DE] Fed. Rep. of Germany ....... 4026232

[51] Int. Cl.$^5$ ........................................... G01M 15/00
[52] U.S. Cl. ................................................ 73/118.1
[58] Field of Search ................. 73/117.2, 117.3, 118.1, 73/117.2, 118.1

[56] References Cited

U.S. PATENT DOCUMENTS 4,809,540 3/1989 Lackner et al. ..................... 73/117.2

FOREIGN PATENT DOCUMENTS 3145732 5/1983 Fed. Rep. of Germany .

Primary Examiner—Jerry W. Myracle
Attorney, Agent, or Firm—Michael J. Striker

[57] ABSTRACT

An arrangement for monitoring a rotational speed sensor of an internal combustion engine having a starter and a rotational speed sensor which supplies an output signal in dependence on a rotational speed, has a unit for measuring a vehicle electrical system voltage, and a control device in which an output signal of the rotational speed sensor is related to a vehicle electrical system voltage and an error operation of the rotational speed sensor is monitored. The measuring unit and the control device are formed so that for error recognition a course of the vehicle electrical system voltage is evaluated during a starting process of the internal combustion engine, and an error recognition is released only when a typical course of a starting process for the vehicle electrical system voltage is recognized and simultaneously no output signal of the rotational speed sensor is recognized.

12 Claims, 2 Drawing Sheets

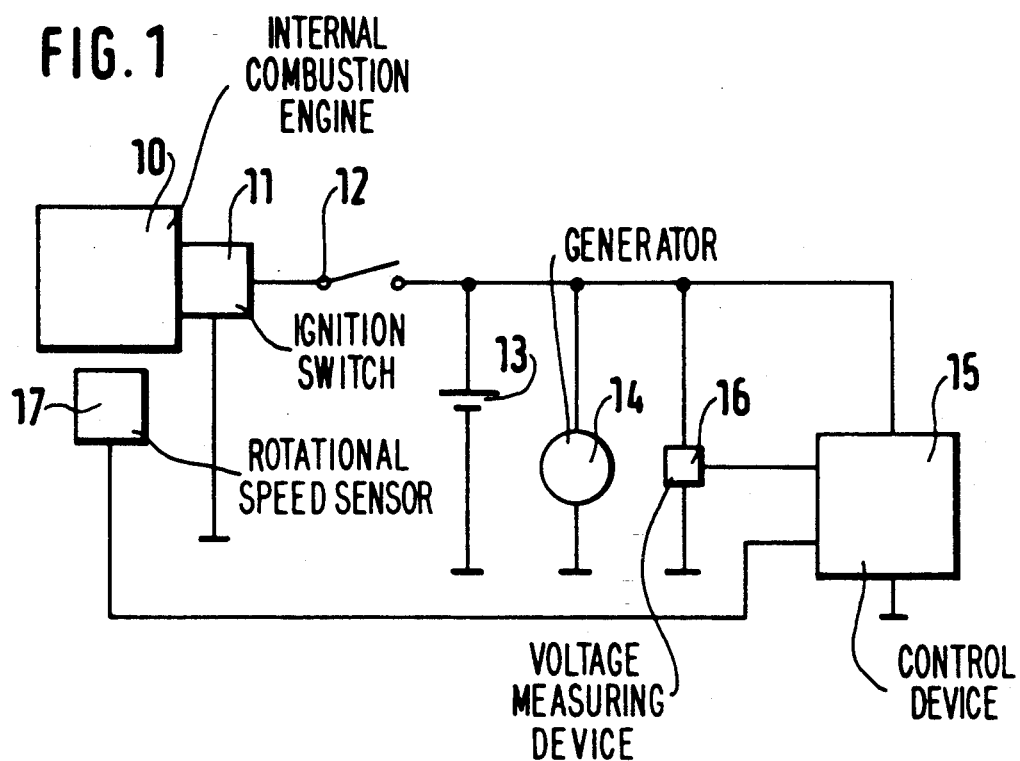
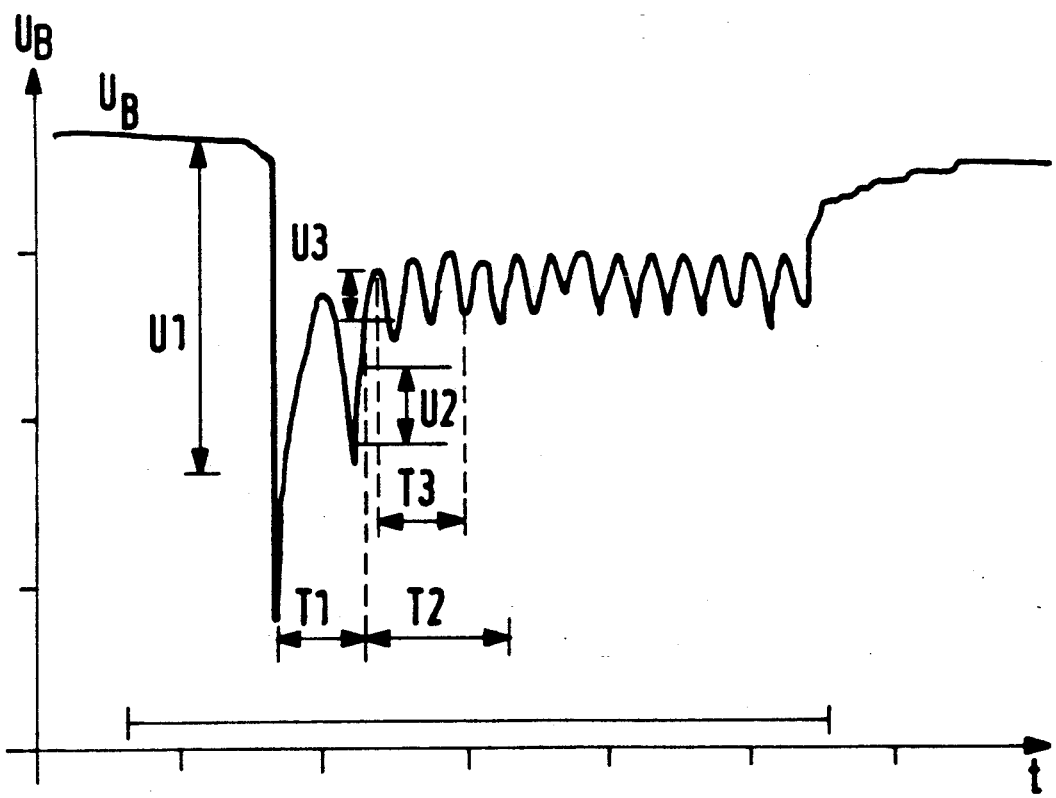

ARRANGEMENT FOR MONITORING ROTATIONAL SPEED SENSOR

BACKGROUND OF THE INVENTION

The present invention relates to an arrangement for monitoring a rotational speed sensor. During the operation of internal combustion engines, especially of electronically regulated internal combustion engines, it is necessary to determine a defect of the rotational speed sensor as fast as possible and with highest possible reliability. Arrangements for monitoring a rotational speed sensor are known. It is possible with these arrangements to determine a defect of the rotational speed sensor or the rotational speed transmitter. One of such arrangements is disclosed, for example, in the German document DE-OS 3,145,732. Here the output signal of a rotational speed sensor is compared with an auxiliary signal, and an error of the rotational speed sensor is determined when an auxiliary signal occurs, however no output signal of the rotational speed sensor is recognized. As an auxiliary signal, the battery voltage is utilized among others. An error operation of the rotational speed sensor is recognized when the battery voltage a certain time after the actuation of the starter exceeds a predetermined threshold, however no output signal of the rotational speed sensor is determined.

In the known arrangement there is however the disadvantage that an error operation of the rotational speed sensor cannot be recognized during the starting process.

Moreover, in the case of non-running of the internal combustion engine it cannot be recognized as well since then the vehicle electrical system voltage does not exceed the threshold value.

SUMMARY OF THE INVENTION

Accordingly, it is an object of the present invention to provide an arrangement for monitoring a rotational speed sensor as well as a method of monitoring the rotational speed sensor which avoids the disadvantages of the prior art.

More particularly, it is an object of the present invention to provide such an arrangement for and method of monitoring the rotational speed sensor in which a defect of the rotational speed sensor can be determined during the actuation of the starter, and also this defect can be determined when the internal combustion engine does not run or due to excessive loading of the vehicle electrical system voltage a predetermined value is not exceeded.

In keeping with these objects and with others which will become apparent hereinafter, one feature of the present invention resides, briefly stated, in an arrangement and a method in accordance with which for error recognition, the course of the vehicle electrical system voltage is determined during the starting process of the internal combustion engine, and an error recognition is released only when the typical course of the vehicle electrical system for the starting process is recognized and simultaneously no output signal of the rotational speed sensor is recognized.

When the arrangement is designed and the method is performed in accordance with the present invention, the abovementioned advantages are achieved and the disadvantages of the prior art are eliminated.

In accordance with another feature of the present invention, an error operation of the rotational speed sensor is recognized when the vehicle electrical system voltage has several characteristic features.

Furthermore, it is recognized that the vehicle electrical system voltage has a first voltage break which is greater than a predetermined value U1, after a delay time T1 oscillations of the vehicle electrical system voltage $U_B$ occur which are greater than a voltage difference U3, within a time T2 a maximum of oscillating vehicle electrical system voltage $U_B$ occurs, within a further time T3 a minimum of oscillating vehicle electrical system voltage $U_B$ occurs and the two successive measuring values in the time sequence of the testing do not exceed a voltage difference U2.

Still a further feature of the present invention is that the evaluation of the course of the vehicle electrical system voltage is performed in a control device.

In accordance with another feature of the present invention, the measurement of the vehicle electrical system voltage is performed at any selected location of the vehicle electrical system.

Still another feature of the present invention is that the rotational speed sensor is formed as an inductive sensor.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 1 is a view of the components of an internal combustion engine in a block diagram with an arrangement in accordance with the present invention;

FIG. 2 is a view showing a typical course of a vehicle electrical system voltage during a starting process of the internal combustion engine.

DESCRIPTION OF THE PREFERRED EMBODIMENTS

Figure 3:
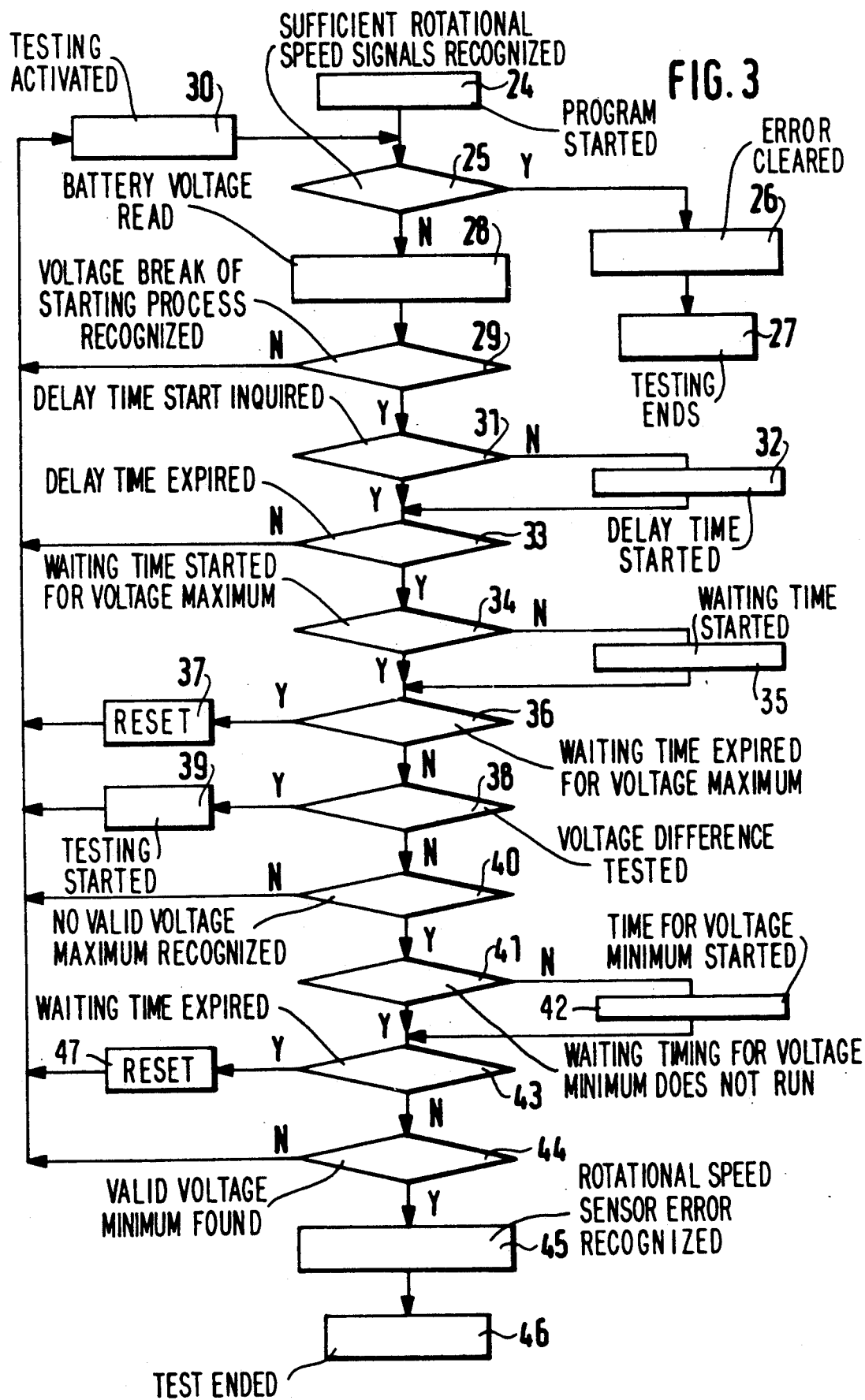
FIG. 3 is a flow diagram for operation monitoring of a rotational speed sensor during each starting process.

In FIG. 1 an internal combustion engine 10 is connected with a battery 13 through a starter 11 and an ignition switch 12. The generator 14 which is driven by it during running of the internal combustion engine supplies the electrical energy which is required for the vehicle electrical system. In a control device 15 the computations required for the control and regulation of the internal combustion engine are performed. A voltage measuring device 16, for example a volt meter, or a voltage measuring device integrated in the control device measures the vehicle electrical system voltage $U_B$ at any location or the battery voltage between the battery terminals and supplies a voltage measuring value to the control device 15. A rotational speed sensor 17, for example a non-inductive rotational speed sensor, measures the rotational speed of the internal combustion engine and supplies to the control device 15 a signal which depends on this rotational speed.

After closing of the ignition switch 12, the starter 11 rotates a not shown crank shaft of the internal combustion engine 10. Simultaneously, the generator 14 starts to rotate. During engagement of the starter it requires a great electrical energy. The vehicle electrical system voltage $U_B$ which normally is regulated to a constant value exhibits a steep break due to the high load. It however increases more or less depending on the outer conditions such as temperature and charging condition of the battery. In a further course of the starting process, the vehicle electrical system $U_B$ shows pronounced oscillations with voltage maximum and voltage minimum.

When the motor is started, the starting process is ended and the vehicle electrical system voltage increases. The generator 14 outputs power to the system, up to the nominal value. In FIG. 2 a typical course of the vehicle electrical system voltage $U_B$ is shown before and after an unsuccessful starting process.

FIG. 2 shows voltage values and respectively voltage differences as well as different times required for the evaluation.

U1 identifies a first voltage difference. Its value is selected so that it is smaller than an expected voltage break but greater than expected voltage changes during switching-on of another electrical consumer which loads the battery. U2 identifies a second voltage difference which is selected so that it is reliably greater than the expected voltage difference between two successive voltage measuring values in time sequence of the testing, during the testing of the oscillating voltage. U3 identifies a voltage difference which is reliably smaller than the difference between a maximum and subsequent minimum of the voltage oscillations.

The times requires for the evaluation are identified with T0 to T3. T0 is a waiting time within which the voltage break of the vehicle electrical system must decrease by the amount U1 (steepness). T1 is a delay time which starts running after the recognition of the first voltage break. The time T2 starts after elapsing of the time T1. Within the time T2 it is tested whether a maximum of the voltage oscillations occurs. After recognizing such a maximum the time T3 starts to run. The times T2 and T3 overlap. Within the time T3 it is tested whether a maximum of the voltage oscillations occurs. The times T2 and T3 are waiting times.

With the help of the so defined voltage differences and respectively times, an evaluation of the battery voltage course is possible. Suitable values for the voltage differences and the times are fixed as below:

U1 = 2.0 volt
U2 = 0.7 volt
U2 = 0.5 volt
T0 = 20 ms
T1 = 300 ms
T2 = 500 ms
T3 = 300 ms The testing rate for the vehicle electrical system voltage amounts to 10 milliseconds. The operation of the device for monitoring a rotational speed sensor can be understood from the flow diagram shown in FIG. 3.

In the step 24 the program is started. In the step 25 it is tested whether sufficient rotational speed signals are recognized. When sufficient rotational speed signals are recognized, the rotational speed sensor operates in an orderly fashion. It is decided with "yes" and with a step 26 and eventually inputted rotational speed sensor error is cleared from the error storage. In a subsequent step 27 the testing ends.

If in the step 25 "no" is recognized, the rotational speed sensor 17 supplies no rotational signal or at least a not sufficient rotational signal. In a step 28 the battery voltage $U_B$ is read, the last three values are stored. In the step 29 it is verified whether the voltage break of the starting process was already recognized. For this purpose it is verified in the step 29 whether the vehicle electrical system voltage lowers from its normal value $U_B$ over the time period T0 by at least a value U1 (steepness).

If in the step 29 it is determined that the voltage break was not recognized, "no" is decided. By a step 30 which activates the testing due to the time sequence the maximum 10 ms is expected, and the program is again restarted.

If to the contrary in the step 29 the voltage break is already recognized, a step 31 is activated. In this step it is inquired whether the delay time T1 was started. If it is not the case, in a step 32 the delay time T1 is started. Then in a step 33 it is verified whether the delay time is already elapsed. When the step 21 recognizes that the delay time was already once started, the direct step 33 is activated. In the step 33 it is recognized that the delay time is not expired. By step 30 the step 25 is again activated, and it is inquired whether sufficient rotational speed signals are recognized meantime.

When the step 33 determines that the delay time T1 expired, it is tested in the step 34 whether the waiting time for the recognition of a voltage maximum is once started. If it is not the case, in the step 35 the waiting time T2 for the occurrence of a voltage maximum is started. If in the step 34 it is recognized that the waiting time T2 for the recognition of a voltage maximum is already started or this time T2 was started in the step 35, it is tested in the step 36 whether the waiting time T2 for the maximum speed is expired.

If in the step 36 it is recognized that the waiting time T2 for the occurrence of voltage maximum is expired, the further program run ends. A reset in the step 37 is performed. The rotational speed sensor test is again started by the step 30 after maximum 10 ms. If, to the contrary, in the step 36 it is recognized that the waiting time T2 is not expired, in the step 38 it is tested whether the voltage difference of both stored voltage values is greater than U2. When this is the case, a reset is performed, and by step 39 and 30 the rotational speed sensor test is again started.

If in the step 38 it is recognized that the voltage change is not too high, in the step 40 it is tested whether a valid voltage maximum is found. For this purpose it is tested whether a voltage value $U_{B0}$ is smaller than the next $U_{B1}$ and is greater than the next voltage value $U_{B2}$.

If a valid voltage maximum is found, in the step 41 it is tested whether the waiting time T3 for a voltage maximum runs. If to the contrary in step 40 no valid voltage maximum was recognized, in the step 30 the step 25 is again started and it is tested whether sufficient rotational speed signals were recognized.

If in the step 41 it is determined that the waiting time T2 for the occurrence of a voltage minimum does not run, then in the step 42 the time T3 for the occurrence of a voltage minimum is started and simultaneously the waiting time T2 for the occurrence of a voltage maximum is maintained. When the waiting time for a voltage minimum runs, it is tested in the step 43 whether the waiting time T2 is expired. If this time expired, a reset is performed in the step 47 and the rotational speed test is again started by the step 30. If the waiting time T3 for a voltage minimum is not expired, in the step 44 it is tested whether a valid voltage minimum is found. For this purpose it is tested whether the condition that the vehicle electrical system voltage $U_{B0}$ is greater than the next value of the vehicle electrical system voltage $U_{B1}$ and this is smaller than the next value of the vehicle electrical system voltage $U_{B2}$.

When this condition is not fulfilled, the rotational speed sensor test starts again by the step 30. If this condition is fulfilled, then a valid voltage minimum is found. It is recognized in a step 45 as rotational speed sensor error and in some cases is inputted in the error storage. The rotational speed sensor test is ended after this in the step 46.

In the flow diagram shown in FIG. 3 for the rotational speed sensor test, for the recognition of a rotational speed sensor error, the following conditions must be fulfilled:

In the step 25 it must be recognized that not sufficient rotational speed signals are supplied to the control device. In the step 29 a voltage break must be recognized, which lasts no longer than the time T0 and is greater than the voltage U1. However, after expiration of a delay time T1 at least a voltage maximum of the oscillating vehicle electrical system voltage $U_B$ is recognized. This voltage maximum must occur within a further time T2 (step 40). In the step 42 within a further time T3 a minimum of the oscillating vehicle electrical system voltage must be recognized. Simultaneously, by the step 38 it is insured that during the recognition of the voltage maxima and respectively voltage minima of the oscillating vehicle electrical system voltage, a voltage difference U2 between two successive measurements in the time sequence of the testing is not exceeded.

The rotational speed sensor diagnosis described in the flow diagram in FIG. 3 or in other words the rotational speed sensor monitoring is performed in a computer device inside the control device and is conventionally performed during each starting process of the internal combustion engine.

It will be understood that each of the elements described above, or two or more together, may also find a useful application in other types of constructions differing from the types described above.

While the invention has been illustrated and described as embodied in a device for monitoring rotational speed sensor, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. An arrangement for monitoring a rotational speed sensor of an internal combustion engine having a starter and a rotational speed sensor which supplies an output signal in dependence on a rotational speed, the arrangement comprising means for measuring a vehicle electrical system voltage; a control device in which an output signal of the rotational speed sensor is related to a vehicle electrical system voltage; and means for recognizing an error operation of the rotational speed sensor so that a course of the vehicle electrical system voltage is evaluated during a starting process of the internal combustion engine, and an error recognition is released only when a typical course of a starting process for the vehicle electrical system voltage is recognized and simultaneously no output signal of the rotational speed sensor is recognized.

2. An arrangement as defined in claim 1, wherein said measuring means and said control device are designed so that an error operation of the rotary rotational speed sensor is recognized when the vehicle electrical system voltage has several characteristic features.

3. An arrangement as defined in claim 1, wherein said measuring means and said control device are formed so that it is recognized that the vehicle electrical system voltage has a first voltage break which is greater than a predetermined value U1, after a delay time T1 oscillations of the vehicle electrical system voltage $U_B$ occur which are greater than a voltage difference U3, within a time T2 a maximum of the oscillating vehicle electrical system voltage $U_B$ occurs, within a further value T3 a minimum of oscillating vehicle electrical system voltage $U_B$ occurs, and two successive measuring values in a time sequence of the sensing do not exceed a voltage difference U2.

4. An arrangement as defined in claim 1, wherein said control device is formed so that the evaluation of a course of the vehicle electrical system voltage is performed in said control device.

5. An arrangement as defined in claim 1, wherein said measuring device is formed so that the measurements of the vehicle electrical system voltage is performed at any selectable location of the vehicle electrical system.

6. An arrangement as defined in claim 1, wherein the rotational speed sensor is an inductive sensor.

7. A method of monitoring a rotational speed sensor of an internal combustion engine having a starter and a rotational speed sensor, comprising the steps of supplying an output of the rotational speed sensor in dependence on a rotational speed; measuring a vehicle electrical system voltage by measuring means; setting the output signal of the rotational speed sensor in reference to the vehicle electrical system voltage; and recognizing an error operation of the rotational speed sensor, said recognizing includes evaluating a course of the vehicle electrical system voltage during a starting process of the internal combustion engine, and releasing an error recognition only when a typical course of the vehicle electrical system voltage for the starting process is recognized and simultaneously no output signal of the rotational speed sensor is recognized.

8. A method as defined in claim 7, wherein said recognizing includes recognizing of an error operation of the rotary rotational speed sensor when the vehicle electrical system voltage has several characteristic features.

9. A method as defined in claim 7, wherein said recognizing includes recognizing that the vehicle electrical system voltage has a first voltage break which is greater than a predetermined value U1, that after a delay time T1 oscillations of the vehicle electrical system voltage $U_B$ occur which are greater than a voltage difference U3, that within a time T2 a maximum of the oscillating vehicle electrical system voltage $U_B$ occurs, that inside a further value T3 a minimum of oscillating vehicle electrical system $U_B$ occurs, and the two successive measuring values in the time sequence of the sensing do not exceed a voltage difference U2.

10. A method as defined in claim 7, wherein said evaluating includes evaluating of the course of the vehicle electrical system voltage in the control device.

11. A method as defined in claim 7, wherein a measurement of the vehicle electrical system voltage is performed in any selectable location of the vehicle electrical system.

12. A method as defined in claim 7, wherein the rotational speed sensor is an inductive sensor.

* * * * *